(12) United States Patent
Iijima

(10) Patent No.: US 11,796,604 B2
(45) Date of Patent: Oct. 24, 2023

(54) MEASURING APPARATUS AND TESTING APPARATUS

(71) Applicant: HIOKI E.E. CORPORATION, Nagano (JP)

(72) Inventor: Junji Iijima, Nagano (JP)

(73) Assignee: HIOKI E.E. CORPORATION, Nagano (JP)

(*) Notice: Subject to any disclaimer, the term of this patent is extended or adjusted under 35 U.S.C. 154(b) by 0 days.

(21) Appl. No.: 17/370,494

(22) Filed: Jul. 8, 2021

(65) Prior Publication Data

US 2022/0018909 A1 Jan. 20, 2022

(30) Foreign Application Priority Data

Jul. 14, 2020 (JP) .................................. 2020-120337
Apr. 8, 2021 (JP) .................................. 2021-065562

(51) Int. Cl.
  *G01R 31/396* (2019.01)
  *G01R 31/3835* (2019.01)
  *G01R 1/073* (2006.01)

(52) U.S. Cl.
  CPC .......... *G01R 31/396* (2019.01); *G01R 1/073* (2013.01); *G01R 31/3835* (2019.01)

(58) Field of Classification Search
  CPC .. G01R 31/396; G01R 1/073; G01R 31/3835; G01R 27/025; G01R 31/392;
  (Continued)

(56) References Cited

U.S. PATENT DOCUMENTS

2012/0200252 A1* 8/2012 Kang ..................... G01R 15/16
                                                                320/107
2014/0285208 A1* 9/2014 Mizuta .................. H01M 10/48
                                                                324/433
(Continued)

FOREIGN PATENT DOCUMENTS

EP     2 506 024 A1   10/2012
FR     3 076 907 A1   7/2019
(Continued)

OTHER PUBLICATIONS

Brebant, FR 3076907 A1—Description, Machine Translation (Year: 2019).*

(Continued)

*Primary Examiner* — Rebecca C Bryant
*Assistant Examiner* — Christopher J Gassen
(74) *Attorney, Agent, or Firm* — GREENBLUM & BERNSTEIN, P.L.C.

(57) ABSTRACT

A measuring apparatus includes: N pairs of probes that are respectively connected to a positive electrode and an external member of N rechargeable batteries that have a capacitance connected in parallel between the positive electrode and the external member; a scanner that selectively switches to one pair of probes out of the N pairs; a measuring apparatus that measures the voltage between the selected probes; and a controller. A plurality of resistance configurations to be connected between each pair of probes are provided. After a standby time has elapsed in a state where the N pairs of probes are connected to the positive electrodes and external members of the N rechargeable batteries, the controller outputs control signals to the scanner to successively switch to each pair of probes and causes the measuring apparatus to measure the voltage between the selected probes every time switching is performed.

6 Claims, 4 Drawing Sheets

(58) Field of Classification Search
CPC .............. G01R 31/385; G01R 19/2503; G01R 31/378; G01R 19/0084; G01R 1/07364; Y02E 60/10; H01M 10/4285
See application file for complete search history.

(56) References Cited

U.S. PATENT DOCUMENTS

| | | |
|---|---|---|
| 2017/0276704 A1 | 9/2017 | Kawanaka et al. |
| 2018/0024198 A1 | 1/2018 | Izawa |
| 2018/0316197 A1 | 11/2018 | Zhang et al. |
| 2020/0287251 A1 | 9/2020 | Yonekura et al. |

FOREIGN PATENT DOCUMENTS

| | | | | |
|---|---|---|---|---|
| FR | 3076907 A1 * | 7/2019 | ......... | G01R 31/3647 |
| JP | 2005-251685 | 9/2005 | | |
| WO | 2019/069390 A1 | 4/2019 | | |

OTHER PUBLICATIONS

Extended European Search Report, dated Dec. 3, 2021, from the European Patent Office (EPO) for patent family member EP Patent Application No. 21184427.9.

\* cited by examiner

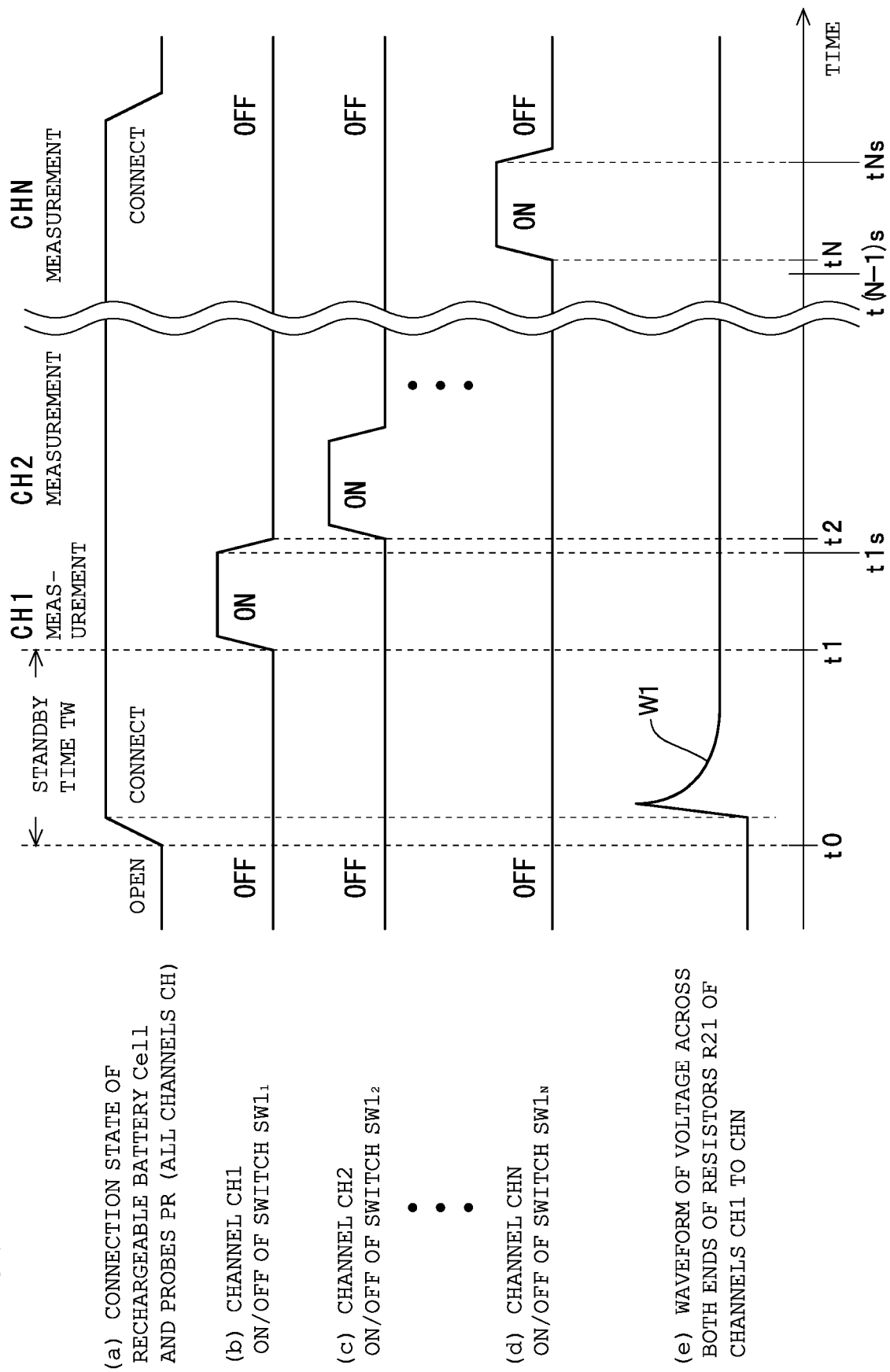

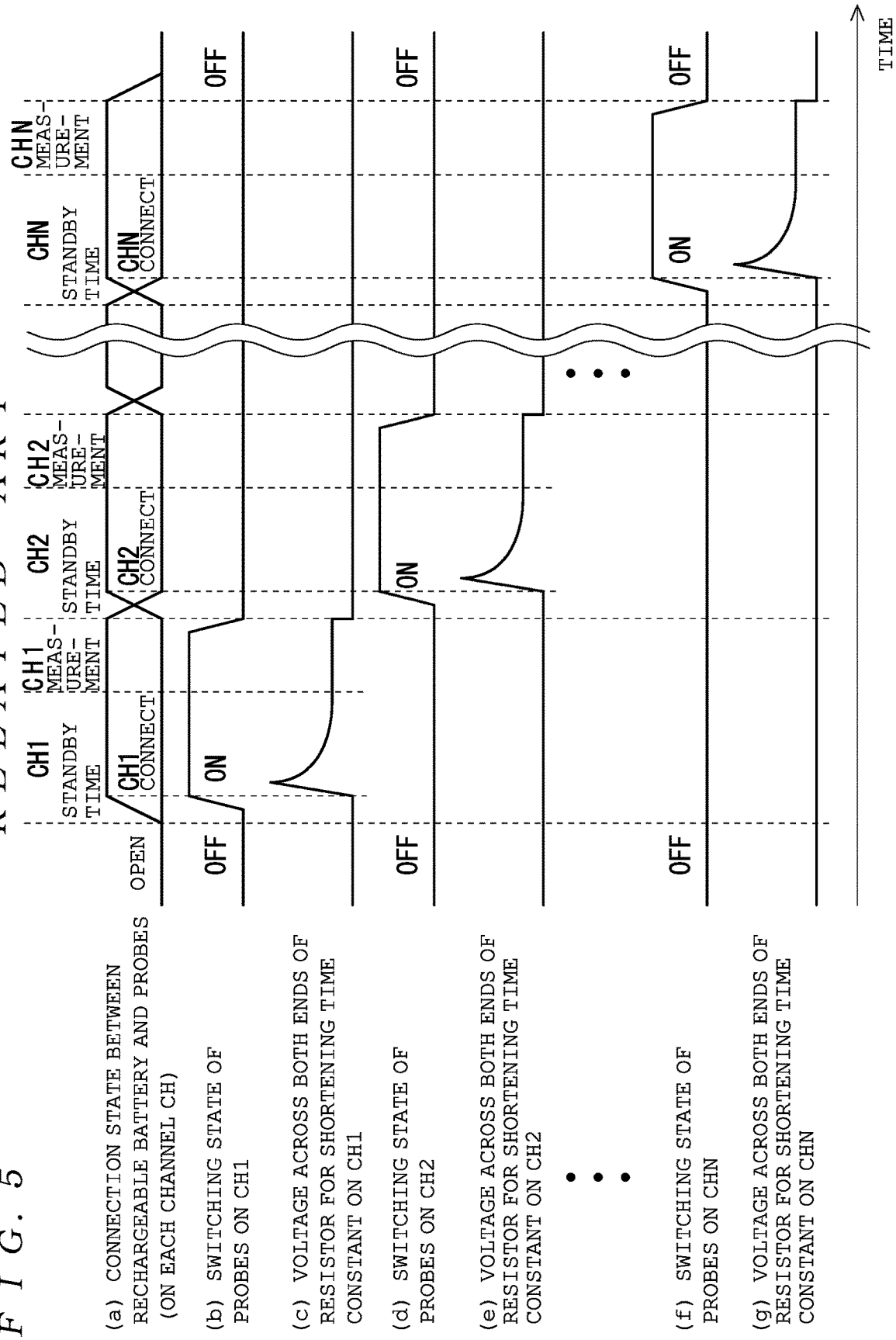

MEASURING APPARATUS AND TESTING APPARATUS

FIELD OF THE INVENTION

The present invention relates to a measuring apparatus that measures a voltage between pairs of voltage measurement target locations on a plurality of measured objects that have the equivalent of an internal capacitance connected in parallel between the pairs of voltage measurement target locations, and to a testing apparatus that is equipped with this measuring apparatus and tests whether each tested object is defective or non-defective.

DESCRIPTION OF THE RELATED ART

Patent Literature 1 cited below discloses a method of testing rechargeable batteries that tests a rechargeable battery with a non-aqueous electrolyte (hereinafter, simply referred to as a "rechargeable battery") as an example of this type of measured object. This rechargeable battery includes: an external member where a laminated film, in which at least a heat-sealing resin layer, a metal layer made of aluminum or an aluminum alloy, and a synthetic resin layer have been laminated in that order, is formed into a bag shape and a heat-sealed portion is formed by heat sealing the heat-sealing resin layers together at the periphery of the opening; an electrode group (including a positive electrode, a negative electrode and a separator) and a non-aqueous electrolyte that are housed in the external member; and a positive electrode terminal connected to the positive electrode and a negative electrode terminal connected to the negative electrode that extend from the external member to the outside. The output voltage of this rechargeable battery is 3.75V to 3.90V.

In this rechargeable battery, pinholes or the like may be present in the resin layer on the inner surface of the laminated film, and when this is the case, lithium ions in the electrolyte react with the aluminum or aluminum alloy in the metal layer to form a lithium-aluminum alloy. This lithium-aluminum alloy has a large coefficient of volumetric expansion and is highly reactive with moisture. For this reason, the rechargeable battery has a problem in that the metal layer breaks down over time and there is a deterioration in its original purpose of acting as a barrier against moisture and the like.

For this reason, in the testing method of a rechargeable battery disclosed in Patent Literature 1, testing for the presence of the problem described above is performed by measuring the voltage between the positive electrode terminal of the rechargeable battery and the metal layer positioned at the heat-sealed portion of the external member with a voltmeter with an input impedance (input resistance) of 1 G ohm or higher, and determining whether the rechargeable battery is defective or non-defective with a voltage range of 0.2V to 3.1V as index values for the determination. When measuring the voltage between the positive electrode terminal and the metal layer of the external member, as one example, one probe out of a pair of probes is placed in contact with the positive electrode terminal and the other probe is placed in contact with the metal layer by passing the tip through the synthetic resin layer located at the sealed part of the external member.

A rechargeable battery with a non-aqueous electrolyte, which is a laminated cell battery, has the equivalent of an internal capacitor connected in parallel between the positive electrode terminal and the metal layer of the external member (hereinafter, this metal layer is simply referred to as the "external member"). This means that when the voltage between the positive electrode terminal and the external member is measured using just a voltmeter with a high input resistance of 1 G ohm or higher, a transient response will occur in keeping with a time constant determined by the capacitance value of the internal capacitor and the resistance value of the input resistance of the voltmeter. Accordingly, there is a long standby time until the voltage between the positive electrode terminal and the external member inputted into the voltmeter reaches a steady state value that can be measured, and as a result, a long time is needed to measure the voltage with the voltmeter in this way. For this reason, to shorten the standby time, the applicant has performed voltage measurement in a state where the equivalent of a resistor for reducing the time constant with a resistance value somewhat smaller than the resistance value of the input resistance of the voltmeter is connected in parallel with the input of the voltmeter. By doing so, the time constant of the transient response is reduced, thereby shortening the standby time until a steady state where measurement is possible is reached.

When using a voltage measuring method where one out of a pair of probes is placed in contact with the positive electrode terminal, the other probe is placed in contact with the external member, and the power supply of the voltmeter is turned on in a state where both probes are already in contact to start voltage measurement, consecutive measurement of a plurality of (here, "N") rechargeable batteries to be measured one after the other will require a long time to connect and disconnect (that is, switch on and off) the power supply of the voltmeter. For this reason, the applicant has adopted a configuration where N pairs of probes are held in a probe holder, and the probe holder operates at the start of voltage measurement so that probes corresponding to the positive electrode terminal and the external member of each rechargeable battery are connected in a single operation.

With a voltage measuring method of this configuration, the probe holder is operated at the start of voltage measurement so that the respective positive electrode terminals and external members of N rechargeable batteries and N pairs of probes all become connected. In this state, N measurement systems (hereinafter "channels CH") are formed by the N pairs of probes and a voltmeter. Next, in this state, as depicted in FIGS. 5(a) and 5(b), a scanner is used to switch to the pair of probes on channel CH1 that are used as the first measurement system out of the N pairs of probes and to connect these probes to the inputs of the voltmeter. When doing so, as depicted in FIG. 5(c), the voltage value of the voltage inputted into the voltmeter (that is, the voltage across the resistor used to shorten the time constant) first rises to a peak voltage and then gradually falls in accordance with the time constant. For this reason, as depicted in FIGS. 5(a) and 5(c), the system waits for the voltage value to reach a steady state, and measurement of the voltage commences when a standby time TW has elapsed.

Next, after completing the voltage measurement for the first rechargeable battery, as depicted in FIGS. 5(a) and 5(d), the scanner switches to the pair of probes on channel CH2 for measuring the voltage of the rechargeable battery that is the second object to be measured and connects these probes to the inputs of the voltmeter. At this time also, as depicted in FIG. 5(e), the voltage value of the voltage inputted into the voltmeter (that is, the voltage across the resistor used to shorten the time constant) first rises to a peak voltage and then gradually falls in accordance with the time constant. For this reason, as depicted in FIGS. 5(a) and 5(e), the system waits for the voltage value to reach a steady state, and measurement of the voltage commences when the standby time TW has elapsed. In the same way, the scanner switches to the pair of probes on each channel CH so that these probes are connected to the inputs of the voltmeter, and measurement of the voltage commences each time when the standby time TW has elapsed. After this, as depicted in FIGS. 5(a) and 5(f), the scanner switches to the pair of probes on the channel CHN for measuring the voltage of the Nth rechargeable battery to be measured and connects these probes to the inputs of the voltmeter. At this time also, as depicted in FIG. 5(g), the voltage value of the voltage inputted into the voltmeter (that is, the voltage across the resistor used to shorten the time constant) first rises to a peak voltage and then gradually falls in accordance with the time constant. For this reason, as depicted in FIGS. 5(a) and 5(g), the system waits for the voltage value to reach a steady state and measurement of the voltage commences when the standby time TW has elapsed. According to this voltage measuring method, by reducing the time constant of the transient response by using a resistor for shortening the time constant, the standby time TW when measuring the voltage on each channel CH is shortened.

Patent Literature 1

Japanese Laid-open Patent Publication No. 2005-251685 (see pages 3 to 9, and FIG. 3)

SUMMARY OF THE INVENTION

However, the voltage measuring method described above that uses a scanner and has been adopted by the applicant has the following problem to be improved. With this voltage measuring method, the standby time TW when measuring on each channel CH is shortened by having the equivalent of a resistor that shortens the time constant connected to the inputs of the voltmeter. However, since measurement only commences after waiting for the standby time TW following the switching to a pair of probes on each channel CH and connecting to the inputs of the voltmeter, voltage measurement requires at least a time equal to the number (N) of rechargeable batteries to be measured multiplied by the standby time TW. This means that when voltage measurement is performed for a large number of rechargeable batteries, the measurement time taken by voltage measurement as a whole is still long. A further reduction in this measurement time is desired.

The present invention was conceived to solve the problem described above and it is a principal object of the present invention to provide a measuring apparatus capable of further reducing the measurement time required by voltage measurement of a measured object and a testing apparatus that is equipped with this measuring apparatus and capable of further reducing the testing time of a rechargeable battery to be tested.

To achieve the stated object, a measuring apparatus according to the present invention comprises: a plurality of pairs of probes that are each connected to a pair of voltage measurement target locations on a plurality of measured objects that each have an equivalent of an internal capacitance connected in parallel between the pair of voltage measurement target locations; a switch that selectively switches to one pair of probes out of the plurality of pairs of probes according to a selective switching signal; a meter that measures a voltage between the probes in the pair of probes that have been selectively switched to according to the selective switching signal; and a controller that outputs the selective switching signal to the switch, wherein a plurality of resistance configurations to be connected between each pair of probes are provided, and after a predetermined standby time has elapsed in a state where the plurality of probes have been connected to each pair of voltage measurement target locations on the plurality of measured objects, the controller outputs the selective switching signal to the switch to cause the switch to successively selectively switch to each pair of probes out of the plurality of pairs of probes and causes the meter to measure the voltage between the probes in the pair of probes that have been selectively switched to every time selective switching is performed.

In the measuring apparatus according to the present invention, the resistance configurations may each include a plurality of resistance circuits with respectively different resistance values and a switching circuit that selectively switches to one out of the plurality of resistance circuits.

In the measuring apparatus according to the present invention, the switching circuit may selectively switch to one out of the plurality of resistance circuits in accordance with a control signal outputted from the controller.

A testing apparatus according to the present invention comprises: any one of the measuring apparatus described above where each pair of probes is connected, as the pair of voltage measurement target locations, to a positive electrode terminal and an external metal member of a laminated lithium-ion cell as a tested object; and a determiner that determines whether the tested object is defective or non-defective based on the voltage between the probes measured by the meter.

The measuring apparatus and the testing apparatus equipped with this measuring apparatus, according to the present invention, include a plurality of resistance configurations to be connected between the respective pairs of probes, and in a state where the plurality of pairs of probes have been respectively connected to the pairs of voltage measurement target locations of the plurality of measured objects, the controller has any charge accumulated in an internal capacitance of all of the measured objects discharged in a single operation via the resistance configurations connected between the pairs of probes. Next, after a standby time has elapsed, the controller successively outputs selective switching signals to a switch to have the switch successively selectively switch to a pair of probes out of the plurality of probes, has a meter measure the voltage between the probes in the pair of probes that have been selectively switched to every time selective switching is performed, and determines whether each measured object (each tested object) is defective or non-defective based on the measured voltage.

Accordingly, with the measuring apparatus and the testing apparatus according to the present invention, before the start of voltage measurement, by merely waiting for the standby time once after the pairs of probes have been connected to the pair of voltage measurement target locations on the plurality of measured objects, it is possible, when measuring the voltage of each measured object, to measure the voltage immediately without waiting for the standby time. As a result, since it is sufficient to wait for the standby time once compared to the existing configuration adopted by the applicant where a time at least equal to the standby time multiplied by the number of measured objects was necessary, the measuring apparatus and the testing apparatus according to the present invention are capable of sufficiently shortening the measurement time required by voltage measurement of a large number of measured objects and also sufficiently shortening the testing time. By increasing the number of pairs of probes, it is possible to further shorten the time required for voltage measurement and testing per measured object.

Also, with the measuring apparatus and the testing apparatus equipped with this measuring apparatus, according to the present invention, by using resistance configurations that each include a plurality of resistance circuits with respectively different resistance values and a switching circuit for selectively switching to one out of the plurality of resistance circuits, it is possible, while using simple and low-cost configurations, to select shortening of the time constant and the accuracy of voltage measurement as desired in accordance with factors such as the type of measured object.

With the measuring apparatus and the testing apparatus equipped with this measuring apparatus, according to the present invention, by having the switching circuit selectively switch to any one out of the plurality of resistance circuits according to the control signal outputted from the controller, it is possible to selectively switch to one of the plurality of resistance circuits in a fully automatic manner.

With the testing apparatus according to the present invention, testing is performed on laminated lithium ion batteries as tested objects by connecting a pair of probes to a positive electrode terminal and an external metal member of each battery as a pair of voltage measurement target locations, performing voltage measurement with the meter, and the determiner determining whether each lithium ion battery is defective or non-defective based on the measured voltage. This means that it is possible to test whether the insulation resistance between the negative electrode terminal and the external metal member of the lithium ion battery is defective or non-defective, and in turn to test whether the lithium ion battery is defective or non-defective in a sufficiently short time.

BRIEF DESCRIPTION OF THE DRAWINGS

FIG. 4 is a timing chart of battery voltage measurement of a rechargeable battery by a measuring apparatus; and FIG. 5 is timing chart of battery voltage measurement of a rechargeable battery by a measuring apparatus adopted by the present applicant.

DESCRIPTION OF THE PREFERRED EMBODIMENTS

Preferred embodiments of a measuring apparatus and a testing apparatus will now be described with reference to the attached drawings.

Figure 2:
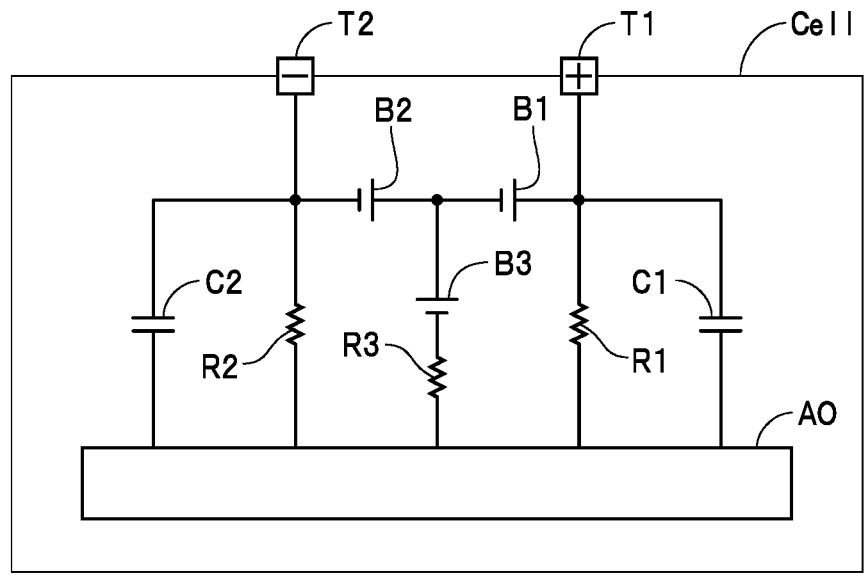
FIG. 2 is an equivalent circuit diagram of the rechargeable battery.

First, the configuration of a rechargeable battery to be tested will be described with reference to the drawings. As depicted in FIG. 2, as one example, a rechargeable battery "Cell" is a rechargeable battery with a non-aqueous electrolyte and is one example of the laminated cell battery described above. The rechargeable battery Cell includes a positive electrode terminal T1, a negative electrode terminal T2, an electrolyte (not illustrated), and an external member AO formed of aluminum. The output voltage across the positive electrode terminal T1 and the negative electrode terminal T2 is 3.75V to 3.90V. Here, the external member AO is configured by molding a laminated film, constructed of a synthetic resin layer (for example, polyethylene) attached on both sides of a metal layer (sealant), into a bag shape or a cup shape. The electrolyte is held inside this external member AO.

Note that in FIG. 2, an internal capacitance (as one example 10 nF) that is equivalently connected in parallel between the positive electrode terminal T1 and the external member AO is depicted as the "capacitor C1", an insulation resistance between the positive electrode terminal T1 and the external member AO is depicted as the "resistor R1", an internal capacitance that is equivalently connected in parallel between the negative electrode terminal T2 and the external member AO is depicted as the "capacitor C2", and an insulation resistance between the negative electrode terminal T2 and the external member AO is depicted as the "resistor R2". In FIG. 2, as an example of the overall internal configuration of the rechargeable battery Cell, an internal electromotive force of 1.0V is depicted as a "battery B1", an internal electromotive force of 2.9V is depicted as a "battery B2", an internal electromotive force of 1.7V whose positive electrode terminal is connected to a junction between the negative electrode terminal of the battery B1 and the positive electrode terminal of the battery B2 is depicted as the "battery B3", and an insulation resistance between the electrolyte, which is connected in series between the negative electrode terminal of the battery B3 and the external member AO, and the external member AO is depicted as a "resistor R3". The rechargeable battery "Cell" of this configuration is a capacitive measurement object, since the capacitor C1 is present when measuring the voltage between the positive electrode terminal T1 and the external member AO of the rechargeable battery Cell. Note that in the present embodiment, since N rechargeable batteries Cell are successively tested as tested objects, the respective batteries are indicated as rechargeable batteries "$Cell_1$" to "$Cell_N$" to distinguish between the respective rechargeable batteries Cell.

Next, the configuration of a testing apparatus 1 as the testing apparatus depicted in FIG. 1 will be described. This testing apparatus 1 tests whether the rechargeable batteries Cell as the tested objects described above are defective or non-defective, and includes: a plurality of pairs (in the present embodiment, N pairs (where N is a natural number and plural)) of probes $PR1_1$, $PR2_1$, $PR1_2$, $PR2_2$, ... $PR1_N$, $PR2_N$ (hereinafter, when not distinguishing between the probes as a whole, the probes are referred to as the "probes PR", when not distinguishing between the probes $PR1_1$, $PR1_2$, ... $PR1_N$, these probes are referred to as the "probe PR1", and when not distinguishing between the probes $PR2_1$, $PR2_2$, ... $PR2_N$, these probes are referred to as the "probes PR2"); a probe holder HD that holds the N pairs of probes PR and moves according to control by a controller CON (described later) to connect the respective probes PR to the positive electrode terminal T1 and the external member AO (in more detail, an external aluminum, which is an external metal member) of each corresponding rechargeable battery Cell; a scanner SC as a switch; a measuring apparatus M as a meter; an operator OP; and a controller CON as a controller. This testing apparatus 1 is equipped with measurement systems on N channels, and is configured to measure the voltages of N rechargeable battery cells connected to the respective channels CH1 to CHN (hereinafter, also referred to as the "channels CH" when not distinguishing between the channels) and test whether the respective rechargeable batteries Cell are defective or non-defective. Note that a measuring apparatus according to the present invention is constructed by the scanner SC, the measuring apparatus M, and the controller CON.

The tip of one probe $PR1_1$ out of the pair of probes $PR1_1$ and $PR2_1$ that construct the channel CH1 is connected to the positive electrode terminal T1 (that is, one out of a pair of "voltage measurement target locations") of the rechargeable battery $Cell_1$ and the base end of this probe $PR1_1$ is connected to the input $IN1_1$ of the scanner SC. The tip of the other probe $PR2_1$ out of the pair of probes $PR1_1$ and $PR2_1$ is connected to the external member AO (that is, the other out of the pair of "voltage measurement target locations") of the rechargeable battery $Cell_1$ and the base end of this probe $PR2_1$ is connected to the input $IN2_1$ of the scanner SC. Similarly, the tip of one probe $PR1_2$ out of the pair of probes $PR1_2$ and $PR2_2$ that construct the channel CH2 is connected to the positive electrode terminal T1 of the rechargeable battery $Cell_2$ and the base end of this probe $PR1_2$ is connected to the input $IN1_2$ of the scanner SC. The tip of the other probe $PR2_2$ out of the pair of probes $PR1_2$ and $PR2_2$ is connected to the external member AO of the rechargeable battery $Cell_2$ and the base end of this probe $PR2_2$ is connected to the input $IN2_2$ of the scanner SC. In the same way, although not illustrated, the tip of one probe $PR1_J$ out of the pair of probes $PR1_J$ and $PR2_J$ (where J is an integer that is three or higher but below N) that construct the channel $CH_J$ is connected to the positive electrode terminal T1 of the rechargeable battery $Cell_J$ and the base end of this probe $PR1_J$ is connected to the input $IN1_J$ of the scanner SC. The tip of the other probe $PR2_J$ out of the pair of probes $PR1_J$ and $PR2_J$ is connected to the external member AO of the rechargeable battery $Cell_J$ and the base end of this probe $PR2_J$ is connected to the input $IN2_J$ of the scanner SC. The tip of one probe $PR1_N$ out of the pair of probes $PR1_N$ and $PR2_N$ that construct the channel $CH_N$ is connected to the positive electrode terminal T1 of the rechargeable battery $Cell_N$ and the base end of this probe $PR1_N$ is connected to the input $IN1_N$ of the scanner SC. The tip of the other probe $PR2_N$ out of the pair of probes $PR1_N$ and $PR2_N$ is connected to the external member AO of the rechargeable battery $Cell_N$ and the base end of this probe $PR2_N$ is connected to the input $IN2_N$ of the scanner SC. Note that as one example, the probe PR2 has a sharp tip, and during voltage measurement, the tip of the probe PR2 is placed in contact with the metal layer by being passed through the synthetic resin layer located at the sealed portion of the external member AO. However, the present invention is not limited to this configuration, and it is also possible to use a configuration where a conductive sheet (rubber) or the like is placed in contact with the end surface of the external member AO and the probe PR2 is placed in contact with this conductive sheet.

The probe holder HD holds the respective probes PR (a plurality of pairs of the probes PR), and at the start of voltage measurement, operates (moves) according to a control signal S3, described later, outputted from the controller CON to connect the positive electrode terminals T1 and the external members AO, which are pairs of voltage measurement target locations of all (that is, the plurality of) rechargeable batteries Cell that are to be connected and the corresponding probes PR in a single operation. However, the probe holder HD is not limited to automatic control in accordance with the control signal S3 outputted from the controller CON, and it is also possible for measurement staff to manually move the probe holder HD at arbitrary timing and connect the positive electrode terminals T1 and the external members AO of all of the rechargeable batteries Cell that are to be connected and the corresponding probes PR at the same time.

The scanner SC is configured to have a function that selectively switches to one pair of probes PR out of a plurality of pairs (in the present embodiment, N pairs) of probes PR in accordance with control signals $S1_1$ to $S1_N$ (or "switching control signals", hereinafter collectively referred to as the "control signal S1" when no distinction is made between the signals) described later outputted from the controller CON and connects the probes PR, which have been selectively switched to, to the measuring apparatus M. In more detail, the scanner SC includes: inputs $IN1_1$, $IN2_1$ to $IN1_N$, $IN2_N$ (hereinafter referred to as the "inputs IN1" when no distinction is made between the inputs $IN1_1$ to $IN1_N$ and referred to as the "inputs IN2" when no distinction is made between the inputs $IN2_1$ to $IN2_N$) to which the N pairs of probes PR are respectively connected; N switches $SW1_1$ to $SW1_N$ (hereinafter referred to as the "switches SW1" when no distinction is made between the switches) for successively selectively switching to a pair of probes PR out of the N pairs of probes PR; N resistors $R21_1$ to $R21_N$ (hereinafter referred to as the "resistors R21" when no distinction is made) and N resistors $R22_1$ to $R22_N$ (hereinafter referred to as "resistors R22" when no distinction is made) that act in combination with the capacitor C1 of the rechargeable batteries Cell to shorten the time constant during transient response; N switches SW2 (switching circuits) for selectively switching to one out of the resistors R21 and R22; outputs OUT1 and OUT2 for outputting an input signal SIN out of the input signals $SIN_1$ to $SIN_N$ (the voltage across the probes PR, hereinafter referred to as the "input signal SIN" when no distinction is made), described later, selectively switched to by the switches SW1; inputs $INS1_1$ to $INS1_N$ (hereinafter referred to as "inputs INS1" when no distinction is made) into which control signals $S1_1$ to $S1_N$ for switching control of the switches $SW1_1$ to $SW1_N$ are inputted; and an input INS2 into which a control signal S2 for switching control of the movable contacts of the above N switches SW2 to the same fixed contacts is inputted. Note that it is also possible to provide the resistors R21 and R22 and the switches SW2 outside the scanner SC.

The respective switches $SW1_1$ to $SW1_N$ perform selective switching control (on/off control) in accordance with the control signals $S1_1$ to $S1_N$ outputted from the controller CON so that one switch SW1 to which a control signal S1 at the high level is outputted is turned on and all of the other switches SW1 to which a control signal S1 at the low level is outputted are turned off. Here, the input signal SIN (that is also the voltage across the resistor R21 or resistor R22 used to shorten the time constant), which is the voltage between the positive electrode terminal T1 and the external member AO of the corresponding rechargeable battery Cell, is outputted to the measuring apparatus M via the pair of probes PR on the channel CH of the switch SW1 that has been controlled so as to be turned on.

The resistors R21 and R22 each construct a resistance circuit and construct one resistance configuration to be connected between each pair of probes PR. By being provided on each channel CH, the resistors R21 and R22 construct a "plurality of resistance configurations" for the present invention. The resistors R21 and R22 are provided to shorten the time constant and as one example, the respective resistance values are 10 M ohm and 100 M ohm. One out of the resistors R21 and R22 is selected by the selective switching by the switches SW2. In a configuration where the resistors R21 and R22 are not provided, when, during voltage measurement of the voltage of a rechargeable battery Cell, the voltage across both ends of the capacitor C1 (that is, the voltage between the positive electrode terminal T1 and the external member AO) of the rechargeable battery Cell is inputted into the measuring apparatus M via the scanner SC as the input signal SIN, the response waveform of the input signal SIN will change in accordance with a time constant determined by the capacitance value of the capacitor C1 and the resistance value of the input resistance R11, described later, of the measuring apparatus M. In that configuration, when the resistance value of the input resistance R11 is set at around 10 G ohms as one example, this large resistance value will produce a large time constant, and as a result, it will take a long time for the voltage value of the input signal SIN to reach the value in the steady state. That is, it will take a long time to measure a voltage value of the input signal SIN.

Figure 1:
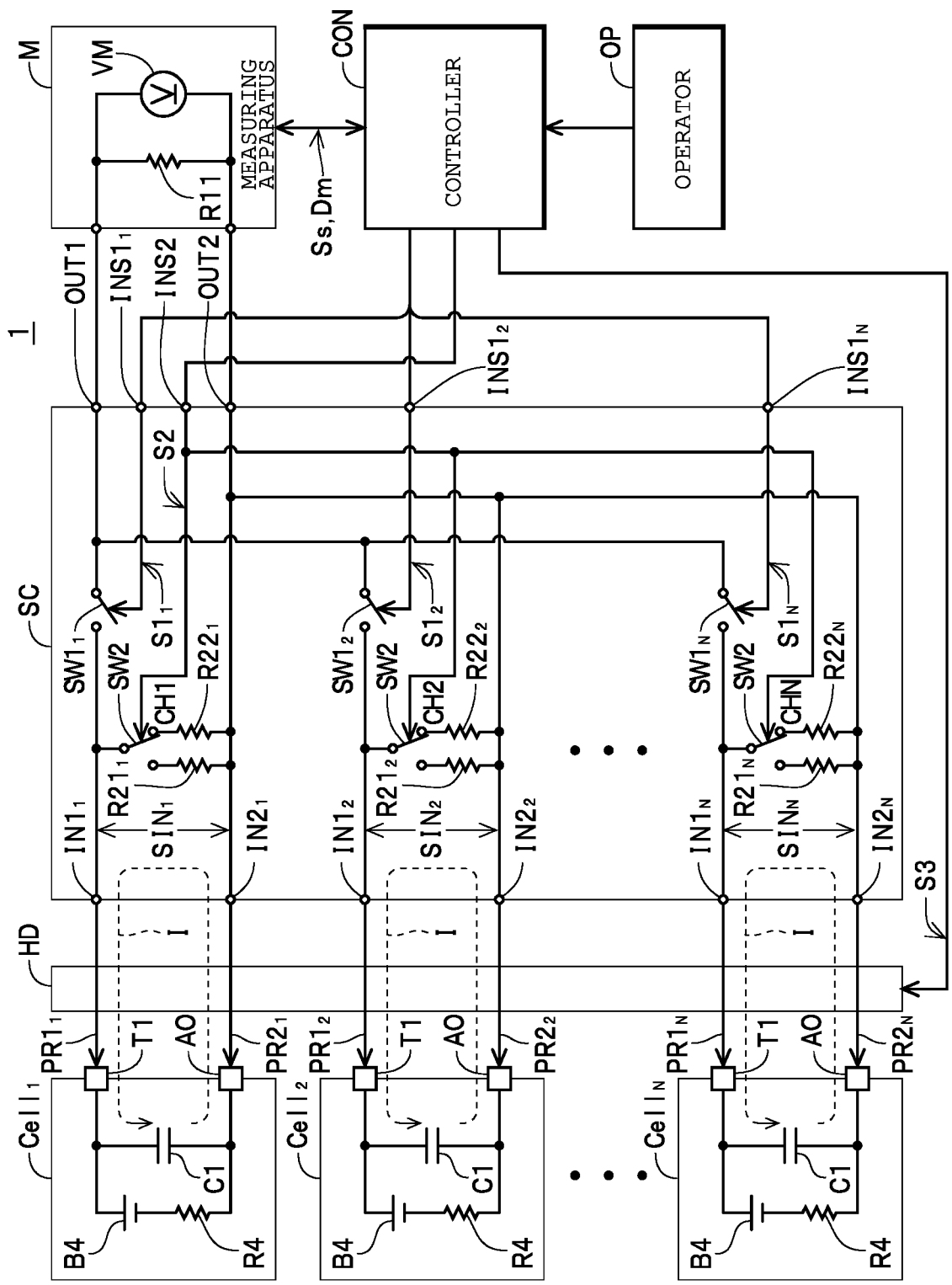
FIG. 1 is a block diagram of a testing apparatus for a rechargeable battery.

On the other hand, as depicted in FIG. 1, it is possible to represent an equivalent circuit between the positive electrode T1 and the external member AO of the rechargeable battery Cell with the internal electromotive forces based on the batteries B1, B2, and B3 described above and an insulation resistance based on the resistors R2 and R3 described above collectively expressed as the "battery B4" and the "resistor R4". Here, when the insulation resistance (the resistor R2) between the negative electrode terminal T2 and the external member AO is extremely favorable (that is, when there is an open circuit between the negative electrode terminal T2 and the external member AO), since the resistance values of the above resistors R2 and R3 are extremely large (as one example, the resistance values are infinite), the voltage value of the battery B4 (which is also the charging voltage value of the capacitor C1) will be almost 0V. Conversely, when the insulation resistance (the resistor R2) between the negative electrode terminal T2 and the external member AO is extremely unfavorable (that is, when the negative electrode terminal T2 and the external member AO are short circuited), the voltage value of the battery B4 (which is also the charging voltage value of the capacitor C1) will be a voltage value that is the sum of the voltage value of the battery B1 and the voltage value of the battery B2. Accordingly, when distinguishing only between these two states (a determination of defective or non-defective), it is possible to measure the voltage between the positive electrode T1 and the external member AO without waiting for a standby time and determine whether the rechargeable battery Cell is defective or non-defective based on the measured value.

However, when the insulation resistance (the resistor R2) between the negative electrode terminal T2 and the external member AO is in an intermediate state between an open circuit and a short circuit, the voltage value of the battery B4 will be a voltage value in keeping with the extent of this intermediate state (that is, whether the state is close to an open circuit or close to a short circuit), and the response waveform of the input signal SIN will change in accordance with the time constant described above immediately after the input signal SIN has been inputted. Accordingly, if the voltage is measured immediately after the input signal SIN has been inputted, there is the risk that it will not be possible to accurately determine whether a rechargeable battery Cell is defective or non-defective. For this reason, it is necessary to measure the voltage value of the input signal SIN in a state where the voltage has settled from the transient state to a steady state according to the time constant (that is, when a standby time TW described later has elapsed from the inputting of the input signal SIN) and then determine whether the rechargeable battery Cell to be measured is defective or non-defective by comparing the voltage value and a threshold voltage set in advance. To shorten this standby time TW, separately to the input resistance R11 inside the measuring apparatus M, the resistors R21 and R22, which shorten the time constant, have resistance values that are a certain degree smaller than (or sufficiently smaller than) the input resistance R11, and act in combination with the capacitance value of the capacitor C1 to produce a small time constant, are provided either at the inputs of the measuring apparatus M or outside the measuring apparatus M (in the present embodiment, outside the measuring apparatus M). When the resistance values of the resistors R21 and R22 are too small, the voltage value of the inputted input signal SIN will become small, resulting in a slight drop in the accuracy of voltage measurement. Accordingly, the resistance values of the resistors R21 and R22 are determined in advance so that these two objects (that is, shortening the time constant and improving the accuracy of voltage measurement) can be selected as desired, and selective switching between the resistors R21 and R22 is performed in accordance with factors such as the type of the rechargeable battery Cell to be measured (that is, the capacitance value of the internal capacitance that is equivalently connected in parallel between the pair of the voltage measurement target locations). Note that the length of the standby time TW and the voltage value of the threshold voltage described above are set in advance in accordance with factors such as the type of the rechargeable battery Cell to be measured.

Each switch SW2 operates in accordance with an instruction signal S2 outputted from the controller CON to selectively switch to one of the resistors R21 and R22.

The measuring apparatus M is configured as a voltage measuring apparatus with extremely high input resistance, like a digital multimeter for example, and as an equivalent circuit, includes an input resistance R11 of about 10 G ohms, for example, and a voltmeter VM that measures the voltage of the input signal SIN (that is, the DC voltage between the positive electrode terminal T1 and the external member AO), which is the voltage to be measured and has been inputted across both ends of the input resistance R11 via the probes PR1 and PR2 and the scanner SC. The voltmeter VM starts measurement when a measurement start signal Ss has been outputted from the controller CON, performs A/D conversion on the input signal SIN using an internal A/D converter to generate measurement data Dm, and outputs the measurement data Dm to the controller CON. The operator OP includes various operation switches for selecting the resistors R21 or R22 for shortening the time constant of the transient response and indicating the start of measurement and end of measurement to the controller CON.

In accordance with various switch signals outputted from the operator OP, the controller CON outputs the control signal S3 described above to control the probe holder HD, outputs the control signal S1 (or "selective switching signal") to execute on/off control of the switches SW1, and outputs the control signal S2 to execute selective switching control of the switches SW2. Every time selective switching of the probes PR is performed, the controller CON outputs the measurement start signal Ss for causing the measuring apparatus M (the voltmeter VM) to measure the voltage between the probes PR and PR out of the pair of probes PR selectively switched to by one of the switches SW1, and thereby executes control over the measuring device M. The controller CON also includes an internal memory composed of a semiconductor memory, a hard disk device, or the like, and stores the measurement data Dm outputted from the measuring apparatus M (the voltmeter VM) in the internal memory.

The controller CON also functions as a determiner, and determines whether a rechargeable battery Cell is defective or non-defective based on the voltage value of the input signal SIN measured by the measuring apparatus M (the voltmeter VM). As described above, the controller CON compares the voltage value of the input signal SIN when the standby time TW has elapsed from the inputting of the input signal SIN and the voltage value has settled into a steady state with the threshold voltage to determine whether the rechargeable battery Cell is defective or non-defective.

Next, the operation of the testing apparatus 1 will be described. Note that it is assumed that all N rechargeable batteries Cell have been placed at a testing position and that N pairs of probes PR are held in advance in the probe holder HD.

First, one of the resistors R21 and R22 is selected in accordance with the capacitance value of the capacitor C1 of the rechargeable battery Cell to be measured and the desired voltage measurement accuracy. In the present embodiment, as one example, it is assumed that the resistors R21, which are 10 M ohm, are selected, and the operation switch of the operator OP for selecting the resistors R21 is operated. When this happens, the controller CON inputs the switch signal from the operation switch and outputs the control signal S2. In response to this, the control signal S2 is outputted via the inputs INS2 to the inside of the scanner SC, and all of the switches SW2 on the respective channels CH switch their movable contacts to the resistor R21 side. Note that when selecting the resistors R22, which are 100 M ohm, the operation switch of the operator OP for selecting the resistors R22 is operated. When this happens, the controller CON inputs the switch signal of the operation switch and outputs the control signal S2. In response to this, the control signal S2 is outputted via the inputs INS2 to the inside of the scanner SC, and all of the switches SW2 on the respective channels CH switch their movable contacts to the resistor R22 side.

Next, the operation switch of the operator OP for indicating the start of testing is operated. When this happens, as depicted in FIG. 4(a), the controller CON controls the probe holder HD at the time t0 where the switch signal of the operation switch is inputted to have the respective probes PR connected to the positive electrode terminal T1 and the external member AO of the corresponding rechargeable batteries Cell in a single operation. At this time, as depicted in FIG. 1, on every channel CH, a current I flows on a current path composed of the positive potential-side terminal (the upper terminal in the drawing) of the capacitor C1 of the rechargeable battery Cell, the positive electrode T1, the probe PR1, the input IN1, the switch SW2, the resistor R21, the input IN2, the probe PR2, the external member AO, and the negative potential-side terminal (the lower terminal in the drawing) of the capacitor C1, so that any charge accumulated in the capacitor C1 is discharged. At this time, as depicted in FIG. 4(e), the voltage waveform W1 generated across both ends of the resistor R21 (which is also the voltage waveform of the voltage across both ends of the capacitor C1) is a voltage waveform with transient response in keeping with a time constant (in the present embodiment, 10 nF×10 M ohm=0.1 second) determined by the capacitance value of the capacitor C1 (in the present embodiment, 10 nF) and the resistance value of the resistor R21 (in the present embodiment, 10 M ohm). In more detail, the voltage value of the voltage waveform W1 reaches a peak voltage value immediately after the time t0 and then gradually decreases in accordance with the time constant to a steady state voltage value.

Next, as depicted in FIGS. 4(a) and 4(b), the controller CON waits from the time t0, and at a time t1 when a predetermined standby time TW that has been set in advance, as one example slightly longer than a time indicated by the time constant, has elapsed, outputs the control signal $S1_1$ to shift the switch $SW1_1$ on the channel CH1 to the on state. At this point, the voltage value of the voltage waveform W1 will have fallen to the voltage value in the steady state, and the input signal $SIN1_1$, which is the voltage across both ends of the resistor R21, is outputted via the switch $SW1_1$ from the outputs OUT1 and OUT2 to the measuring apparatus M. When doing so, the controller CON outputs the measurement start signal Ss to the measuring apparatus M (the voltmeter VM) at the same time as the outputting of the control signal $S1_1$. In response to this, the measuring apparatus M (the voltmeter VM) performs A/D conversion on the inputted input signal $SIN1_1$ to generate the measurement data Dm (measurement of the voltage between the probes) and outputs to the controller CON (measurement on channel CH1). Next, the controller CON measures (calculates) the voltage value between the positive electrode T1 and the external member AO of the rechargeable battery $Cell_1$ based on the inputted measurement data Dm. Here, since the voltage value measured by the controller CON is the voltage value in the steady state, when the insulation resistance (the resistor R2) between the negative electrode terminal T2 and the external member AO is normal, the voltage value will be measured as a voltage value that is lower than the threshold voltage, but when the insulation resistance (the resistor R2) is abnormal, the voltage value will be measured as a voltage value that is higher than the threshold voltage. Accordingly, the controller CON accurately determines whether the rechargeable battery $Cell_1$ is defective or non-defective based on the measured voltage value and the threshold voltage.

Next, the controller CON stops the outputting of the control signal $S1_1$ and the measurement start signal Ss at time t1s to stop voltage measurement of the rechargeable battery $Cell_1$ by the measuring apparatus M (the voltmeter VM), and also ends the testing of defective or non-defective for the rechargeable battery $Cell_1$. At this time, on each channel CH, any electric charge that has accumulated in the capacitors C1 of all the rechargeable batteries Cell will have already been discharged, so that the voltage waveform W1 on every channel CH will be the voltage value in the steady state. For this reason, the controller CON outputs the control signal S12 at the time t2 immediately after the time t1s without waiting for the standby time TW to shift the switch $SW1_2$ of the channel CH2 to the ON state and outputs the measurement start signal Ss to cause the measuring apparatus M (the voltmeter VM) to commence voltage measurement for the rechargeable battery $Cell_2$ which is to be measured next. Here also, in the same way as the voltage measurement and the determination of defective or non-defective for the rechargeable battery $Cell_1$, the controller CON measures (calculates) the voltage value of the rechargeable battery $Cell_2$ based on the measurement data Dm outputted from the measuring apparatus M (the voltmeter VM) and also determines whether the rechargeable battery $Cell_2$ is defective or non-defective based on the measured voltage value and the threshold voltage. After this, in the same way as the voltage measurement and determination of defective or non-defective for the rechargeable battery $Cell_1$, the controller CON stops the outputting of the control signal S12 and the measurement start signal Ss to stop the voltage measurement of the rechargeable battery Cell$_2$ by the measuring apparatus M (the voltmeter VM) and ends the determination of defective or non-defective for the rechargeable battery Cell$_2$.

After this, in the same way as the voltage measurement and determination of defective or non-defective for the rechargeable battery Cell$_2$, the controller CON executes the voltage measurement and determination of defective or non-defective for the rechargeable battery Cell$_3$ to the rechargeable battery Cell$_{(N-1)}$, stops the outputting of the control signal S1$_{(N-1)}$ and the measurement start signal Ss at the time t(N−1)s to stop the voltage measurement of the rechargeable battery Cell$_{(N-1)}$ by the measuring apparatus M (the voltmeter VM) and ends the determination of defective or non-defective for the rechargeable battery Cell$_{(N-1)}$. Next, the controller CON outputs the control signal S1$_N$ at the time tN immediately after the time t(N−1)s to shift the switch SW1$_N$ on the channel CHN to the on state and also outputs the measurement start signal Ss to cause the measuring apparatus M (the voltmeter VM) to start voltage measurement of the rechargeable battery Cell$_N$, which is the final measured object. Here also, in the same way as the voltage measurement and determination of defective or non-defective for the rechargeable batteries Cell$_1$ to Cell$_{(N-1)}$, the controller CON measures (calculates) the voltage value of the rechargeable battery Cell$_N$ based on the measurement data Dm outputted from the measuring apparatus M (the voltmeter VM) and executes a determination of defective or non-defective for the rechargeable battery Cell$_N$ based on the measured voltage value and the threshold voltage. After this, at the time tNs, the controller CON stops the outputting of the control signal S1$_N$ and the measurement start signal Ss to complete the voltage measurement and determination of defective or non-defective for all of the rechargeable batteries Cell, and by doing so, ends the testing of the N rechargeable batteries Cell.

In this way, the measuring apparatus M and the testing apparatus 1 are provided with the plurality of resistors R21 (and the resistors R22) connected between the pair of probes PR on each channel CH. Before the start of voltage measurement, in a state where N pairs of probes PR have been connected to the positive electrode terminals T1 and the external members AO of the N rechargeable batteries Cell, the controller CON discharges any charge accumulated in the respective capacitors C1 of all of the rechargeable batteries Cell in a single operation via the resistors R21 (or the resistors R22) connected between the respective probes PR. Next, after the standby time TW has elapsed, the controller CON successively outputs the control signals S1 to the scanner SC to successively selectively switch to a pair of probes PR out of the N pairs of probes PR. Every time the selective switching is performed, the controller CON causes the measuring apparatus M (the voltmeter VM) to perform A/D conversion (measurement) on the voltage between the probes of the pair of probes PR that have been selectively switched to (that is, the input signal SIN), measures the voltage value of the input signal SIN based on the converted measurement data Dm, and determines whether each rechargeable battery Cell is defective or non-defective based on this measured value.

Accordingly, before the start of voltage measurement, by merely waiting for the standby time Tw once after the N pairs of probes PR have been connected to the positive electrode terminals T1 and the external members AO of the N rechargeable batteries Cell, it is possible, when measuring the voltage of each rechargeable battery Cell, to measure the voltage immediately without waiting for the standby time TW. As a result, since it is sufficient to wait for the standby time TW once compared to the existing configuration adopted by the applicant where a time at least equal to the standby time TW multiplied by N was necessary, the measuring apparatus M and the testing apparatus 1 are capable of sufficiently shortening the measurement time required by voltage measurement of a large number of rechargeable batteries Cell and also sufficiently shortening the testing time. By increasing the number of N pairs of probes PR, it is possible to further shorten the time required for voltage measurement and testing per rechargeable battery Cell.

Also, by using resistance configurations that each include a plurality of resistors R21 and R22 with respectively different resistance values and a switch SW2 for selectively switching to one out of the plurality of resistors R21 and R22, it is possible, while using simple and low-cost configurations, for the measuring apparatus M and the testing apparatus 1 to select shortening of the time constant and the accuracy of voltage measurement as desired in accordance with factors such as the type of measured object.

By having the switches SW2 selectively switch to any one out of the plurality of resistors R21 and R22 according to the control signal S2 outputted from the controller CON, the measuring apparatus M and the testing apparatus 1 can selectively switch to one of the resistors R21 and R22 in a fully automatic manner.

According to this testing apparatus 1, testing is performed on laminated lithium ion batteries as tested objects by connecting a pair of probes PR to a positive electrode terminal T1 and an external member AO of each battery as a pair of voltage measurement target locations, performing voltage measurement with the measurement apparatus M (the voltmeter VM), and the controller CON (or "determiner") determining whether each rechargeable battery Cell is defective or non-defective based on the measured measurement data Dm (that is, the voltage between the probes PR). This means that it is possible to test whether the insulation resistance (the resistor R2) between the negative electrode terminal T2 and the external member AO of the rechargeable battery Cell is defective or non-defective, and in turn to test whether the rechargeable battery Cell is defective or non-defective in a sufficiently short time.

Note that in the present embodiment, although dead time is provided between the timing at which the switch SW1 of one channel CH is turned off (for example, the time t1s) and the timing at which the switch SW1 of the next channel CH is turned on (for example, the time t2) to avoid a state where two switches SW1 are simultaneously on due to the time taken for the switch SW1 to become completely off (the fall time) and the time taken to become completely on (the rise time), when two switches being on at the same time is not problematic, this dead time does not need to be provided.

Also, although in the present embodiment, the controller CON determines whether a rechargeable battery Cell is defective or non-defective every time voltage measurement is executed for a rechargeable battery Cell, the present invention is not limited to this. As one example, it is also possible for the controller CON to not execute a determination of defective or non-defective every time voltage measurement is executed for a rechargeable battery Cell and to instead collectively execute a determination of defective or non-defective for all of the rechargeable batteries Cell when voltage measurement has been completed for all of the rechargeable batteries Cell$_1$ to Cell$_N$.

The resistance circuits (the resistors R21 and R22) according to the present invention do not need to be constructed of a single resistance element, and may be configured by connecting a plurality of resistance elements in parallel and/or in series. Also, although the present embodiment uses a configuration where switching is performed between two types of resistors R21 and R22 with different resistance values so that one of the resistors (the resistor R21 or the resistor R22) is selected, the present invention is not limited to this. As one example, it is possible to adopt a configuration in which three or more types of resistors with different resistance values are provided and one or more of the resistors is selected, or a configuration where only one resistance circuit with a predetermined resistance value is included (that is, a configuration that does not selectively switch to at least one resistance circuit out of a plurality of resistance circuits with different resistance values).

Also, although an example where each switching circuit inside the scanner SC is constructed of the mechanical switches SW1 and SW2 has been described, it is also possible to construct a switching circuit with a relay, a semiconductor switch, or the like.

Figure 3:
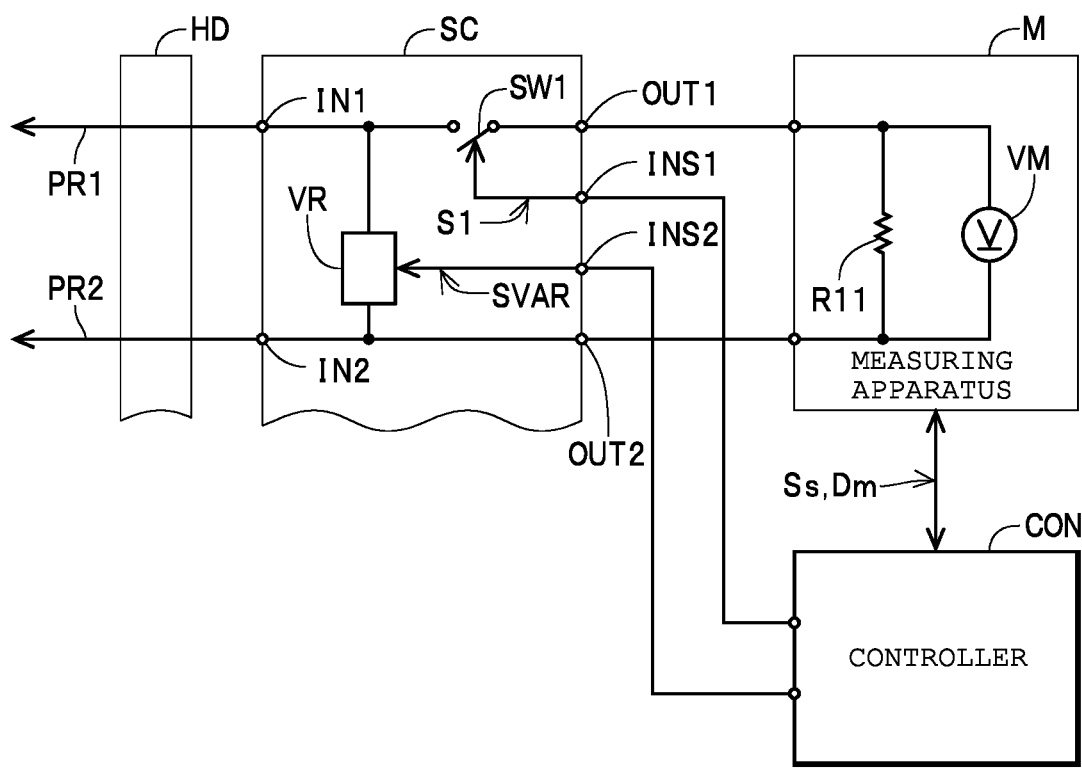
FIG. 3 is another block diagram of a scanner with a different resistance configuration.

As another example, as depicted in FIG. 3, a digital potentiometer VR can be used as a resistance configuration in place of the resistors R21 and R22. In this configuration, by setting the resistance value via the operator OP, the controller CON outputs a control signal SVAR so that the resistance value of the digital potentiometer VR becomes the specified resistance value. Note that component elements depicted in FIG. 3 that are the same as the component elements of the testing apparatus 1 described above are designated by the same reference numerals and duplicated description is omitted. According to this configuration, it is possible to select shortening of the time constant and the accuracy of the voltage measurement as desired according to factors such as the type of measured object.

Although measurement and testing are performed on a non-aqueous electrolyte rechargeable battery Cell as a measured object and as a tested object, which is a laminated cell battery, in the above example, the present invention is not limited to this, and so long as measurement and testing are performed on a plurality of measured objects as measured objects and as tested objects, where an internal capacitance is equivalently connected in parallel between a pair of voltage measurement target locations, it is also possible to perform measurement and testing of other types of rechargeable batteries as measured objects and as tested objects. The present invention is also not limited to rechargeable batteries, and it is possible to perform measurement and testing on a variety of elements, circuits, and the like as measured objects and as tested objects.

What is claimed is:

1. A measuring apparatus, comprising:
a plurality of predetermined pairs of probes, where each predetermined pair of probes is connected to a pair of voltage measurement target locations on a measured object of a plurality of measured objects, each measured object having an equivalent of an internal capacitance connected in parallel between the pair of voltage measurement target locations;
a switch that selectively switches to one predetermined pair of probes out of the plurality of predetermined pairs of probes according to a selective switching signal;
a meter that measures a voltage between the probes in the one predetermined pair of probes that have been selectively switched according to the selective switching signal; and
a controller that outputs the selective switching signal to the switch,
wherein a plurality of resistance configurations to be connected between each predetermined pair of the plurality of predetermined pairs of probes are provided, and
wherein during a predetermined standby time, in a state where the plurality of predetermined pairs of probes have been connected, in a single operation, to each pair of voltage measurement target locations on the plurality of measured objects, a voltage value of a voltage waveform generated across both ends of all the plurality of resistance configurations reach a peak voltage value and gradually decrease to a steady state voltage value, and
after the predetermined standby time has elapsed, the voltage value of the voltage waveform will have fallen to the steady state voltage value, and the controller outputs the selective switching signal without waiting for another predetermined standby time to the switch causing the switch to successively and selectively switch to each predetermined pair of probes out of the plurality of predetermined pairs of probes and causes the meter to measure the voltage between the predetermined pair of probes that have been selectively switched to every time selective switching is performed.

2. The measuring apparatus according to claim 1, wherein each of the plurality of resistance configurations includes a plurality of resistance circuits with respectively different resistance values and a switching circuit that selectively switches to one out of the plurality of resistance circuits.

3. A testing apparatus, further comprising:
the measuring apparatus according to claim 2 where each predetermined pair of the plurality of predetermined pairs of probes is connected to a positive electrode terminal and an external metal member of a laminated lithium-ion cell as a tested object, as a selected pair of voltage measurement target locations; and
a determiner that determines whether the tested object is defective or non-defective based on the voltage between the probes in the one predetermined pair of probes measured by the meter.

4. The measuring apparatus according to claim 2, wherein the switching circuit selectively switches to one out of the plurality of resistance circuits in accordance with a control signal outputted from the controller.

5. A testing apparatus, further comprising:
the measuring apparatus according to claim 3 where each predetermined pair of the plurality of predetermined pairs of probes is connected to a positive electrode terminal and an external metal member of a laminated lithium-ion cell as a tested object, as a selected pair of voltage measurement target locations; and
a determiner that determines whether the tested object is defective or non-defective based on the voltage between the probes in the one predetermined pair of probes measured by the meter.

6. A testing apparatus, further comprising:
the measuring apparatus according to claim 1 where each predetermined pair of the plurality of predetermined pairs of probes is connected to a positive electrode terminal and an external metal member of a laminated lithium-ion cell as a tested object, as a selected pair of voltage measurement target locations; and a determiner that determines whether the tested object is defective or non-defective based on the voltage between the probes in the one predetermined pair of probes measured by the meter.

* * * * *